United States Patent [19]

Bohlen et al.

[11] 4,169,230

[45] Sep. 25, 1979

[54] METHOD OF EXPOSURE BY MEANS OF CORPUSCULAR BEAM SHADOW PRINTING

[75] Inventors: Harald Bohlen, Boeblingen; Johann Greschner, Pliezhausen; Werner Kulcke; Peter Nehmiz, both of Boeblingen, all of Fed. Rep. of Germany

[73] Assignee: International Business Machines Corporation, Armonk, N.Y.

[21] Appl. No.: 904,069

[22] Filed: May 8, 1978

[30] Foreign Application Priority Data

Dec. 6, 1977 [DE] Fed. Rep. of Germany ....... 2739502

[51] Int. Cl.² ............................................. A61K 27/02
[52] U.S. Cl. ................................ 250/492 A; 250/400; 250/492 R
[58] Field of Search ........... 250/492 R, 492 A, 492 B, 250/400

[56] References Cited

U.S. PATENT DOCUMENTS

| | | | |
|---|---|---|---|
| 3,326,176 | 6/1967 | Sibley | 250/492 A |
| 3,811,069 | 5/1974 | O'Keefe | 250/492 A |

OTHER PUBLICATIONS

"High Speed Beam Pattern Generation" by G. L. Yarnell et al., Electrochemical Society, pp. 510, 511, Abstract #218.

"A Solution to the Mask Stencil Problem" by Heritage et al., Proc. Symposium on Electron & Ion Beam Science, Seventh Int. Conf., 1976, pp. 348-360.

Primary Examiner—Harold A. Dixon
Attorney, Agent, or Firm—James M. Thomson

[57] ABSTRACT

A method of exposure of a target object by means of corpuscular beam shadow printing through a mask with several complementary zones wherein the beam, shiftable and tiltable about a point in the mask plane and arranged in parallel at a small distance from the target object, is first impinged upon a first of the complementary zones, then the object is shifted under a second of the complementary zones, and the positioning of the beam is changed so that any deviation of the actual position of the second area of the target object to be exposed from its nominal position is determined and compensated for by tilting the beam about a point substantially in the mask plane.

2 Claims, 7 Drawing Figures

METHOD OF EXPOSURE BY MEANS OF CORPUSCULAR BEAM SHADOW PRINTING

DESCRIPTION

Technical Field

In the production of integrated semiconductor circuits it is well known to define in each step the semiconductor wafer areas to be processed, with each wafer generally containing hundreds of the same type of individual circuits. Such definition is performed by means of photoresist layers which are exposed with the respective pattern, and subsequently developed. With increasing miniaturization of the integrated circuits it has become more and more difficult to transfer by light-optics the necessary and very finely structurized patterns from the originals called masks onto the photoresist coated semiconductor wafers.

In order to transfer the finely structurized masks onto semiconductor wafers, specifically designed lenses with increasing resolution and precision, or improved shadow printing processes (contact or proximity printing) have been used for the so-called projection process. However, as with lenses of optimum quality, the extremely high resolution and the necessary precision could be found in the paraxial range only. Therefore, the patterns to be brought onto the semiconductor wafer had to be transferred step by step in hundreds of individual exposures by means of so-called step-and-repeat cameras. Furthermore, in the above-mentioned shadow printing processes, diffraction of the light with very finely structurized patterns caused defects at the edges of the mask openings which prevented further miniaturization of the integrated circuits. As further development of integrated semiconductor circuits require conductor and circuit elements with diameters and distances of much less than 1 $\mu$m, and since the maximum resolution limit obtainable in all known optical processes is approximatively 2 $\mu$m, exposure by corpuscular beams, and particularly by electron beams was adopted.

Since known corpuscular beam lenses having a sufficiently large image field do not have the required resolution, and in particular not the extremely high freedom from distortion, a so-called shadow printing process has now been adopted wherein corpuscular beams are used through which structures with a diameter of 0.1 $\mu$m can easily be transferred with the precision necessary for making sub-miniaturized integrated semiconductor circuits.

It is known that all solid bodies are practically completely opaque for corpuscular beams so that for masks to be used with said beams no transparent substrates are available. While for electro-magnetic radiation in the visible range the masks consist of a glass or quartz plate serving as transparent carrier which is coated with a thin metal layer containing a pattern of highly complicated, interleaved, or annularly shaped openings, there are no substances which in connection with corpuscular beams could be used as transparent substrates. As a consequence corpuscular beams can transfer only island-shaped isolated areas which moreover have to be spaced from each other to such an extent that the masks are still self-supporting, i.e. that they show the necessary mechanical rigidity. The form of the patterns that can be transferred by this type of mask is, therefore, considerably restricted. However, as the patterns to be transferred in the production of integrated semiconductor circuits always consist not only of isolated island-shaped areas but also of annular or very complicated and interleaved structures, exposure by corpuscular beams by means of shadow printing has turned out to be practically unrealizable in the production of integrated semiconductor circuits, in spite of the extremely high resolution of this process.

As indicated in the literature references "A Solution to the Mask 'Stencil' Problem in Electron Beam Projection Microfabrication" by M. B. Heritage, 7th International Conference on Electron and Ion Beam Science and Technology, May 1976, Washington DC, Pages 487 and 488, "Transmission Masters for Demagnifying Electron Projection": by A. Meyer et al., above, and "An Electron Image Projector with Automatic Alignment" by J. P. Scott, IEEE Transactions on Electron Devices, July 1975, Vol. ED-22, No. 7, Pages 409 to 413, it has been suggested to connect the island-shaped opaque mask areas required for the imaging of annular patterns to the resist of the mask by means of very thin bridges, to avoid the stencil effect, the thickness of which is below the resolution of the respective imaging process. Masks with several long, parallel slots with a small spacing between each other can also be made in this manner. The same applies to masks arranged on cross-line screens consisting of very thin bars.

The above mentioned processes, however, are applicable in the manufacture of miniaturized integrated semiconductor circuits only with demagnifying projection printing. Otherwise, the patterns to be transferred are disturbed by the imaging of the bars or of the cross-lines. This process can, therefore, not be employed for making highly miniaturized integrated semiconductor circuits since the production of masks to be imaged in a highly reduced scale is extremely complicated and time-consuming. Moreover, only relatively small areas of a semiconductor wafer can be simultaneously exposed with this method, so that production with this process would not be economical due to the high amount of time involved, as well as due to the alignment problems connected with the repeated individual exposures.

In the first one of the above-mentioned literature references a process is described where the patterns represented on a glass plate by metallized areas are transferred by means of photoelectron emission onto the photoresist layer to be exposed. As the semiconductor wafer is part of the anode of the imaging system there appear in the patterns, particularly in semiconductor wafers distorted by preceding process steps or already equipped with parts of the circuit, distortions of the transferred patterns and other disturbances which are an obstacle to practical application.

In the same literature reference a process is described where the pattern to be transferred is transformed into a pattern consisting of squares of substantially the same size. With such a mask the photoresist layer is exposed in two, four or more relative positions between the mask and semiconductor wafer, with the individual partial exposures effected by island-shaped mask openings representing the overall pattern. However, this process is restricted to patterns composed of rectangular structures. Furthermore, the making of the pattern generally causes multiple exposures of the photoresist covering the substrate when the line widths are not integer even multiples of the squares. Multiple exposures, however, can cause a widening of the exposed structure. Moreover, the alignment of the individual partial exposures, whose diameter generally amounts only to fractions of the diameter of the pattern elements to be generated, is so complicated that a practical application of this process is not possible in the production of conventional integrated circuits. None of the above described processes is, therefore, suitable for the projection of highly miniaturized, integrated semiconductor circuits.

SUMMARY OF THE INVENTION

It is the object of the invention to provide a process avoiding the above-mentioned disadvantages and permitting the transfer of any pattern with diameters and spacings of the individual conductive lines and circuit elements of 0.1 μm and less by means of shadow printing in parallel and simultaneously on relatively large areas of semiconductor wafers. It should be furthermore possible to permit the transfer of such patterns with relatively simple devices and in relatively short periods with high precision and substantially independently of external disturbances onto semiconductor wafers, without restriction of the form of the patterns and/or the size of the fields to be exposed simultaneously.

As the process according to the invention does not use any imaging elements the apparatus involved is uncomplicated and the transferred patterns are free from imaging errors and distortions. For the same reason there are practically no restrictions for the size of the fields transferred simultaneously which preferably will have the size of one complete circuit. However, it is also possible to transfer simultaneously a larger amount of circuits, i.e., the circuits of an entire semiconductor wafer.

As the alignment of the semiconductor wafers to be exposed with respect to the individual complementary masks comprises a coarse positioning by shifting the semiconductor wafer, and a fine positioning by controllably altering the angle of incidence of the electron beam onto the mask, the individual exposures can be executed in a much quicker succession than in the formerly known processes. Due to the size of the simultaneously transferred fields and the brief alignment periods the times required for exposing an entire semiconductor wafer are shorter by a factor of ten than in formerly known similar processes. Since coarse positioning by mechanical shifting of the semiconductor wafer and fine positioning by controllably altering the angle of incidence of the electron beam are performed independently of each other for an alignment precision of 5% for the shiftable table carrying the semiconductor wafer and of 1% for the deflection electronics of the electron beam will be sufficent; these are values which can easily be realized but also easily improved still further.

BRIEF DESCRIPTION OF THE DRAWINGS

The invention will be described below in detail by means of the drawings which show the following.

DETAILED DESCRIPTION OF THE INVENTION

Figure 1A:
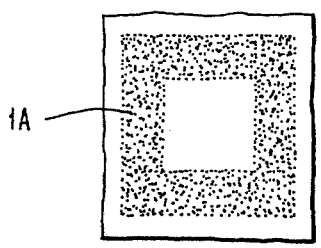
FIG. 1A to 1C is a pattern to be transferred by a prior art mask for corpuscular beam shadow printing and the generation of this pattern shown in FIG. 1A by means of the mask of FIG. 1B.
Figure 1B:
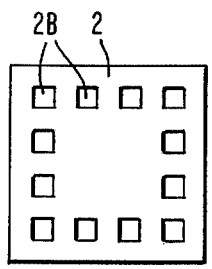
Figure 1C:
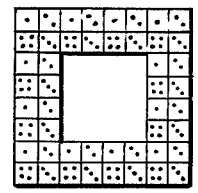

The pattern represented in FIG. 1A by a raster area 1A is transferred by mask 2 shown in FIG. 1B and consisting of openings 2B. In a manner known per se one respective exposure is performed in four different positions of mask 2. In FIG. 1C the positions of the mask openings at the first, second, third and fourth exposure are represented by squares containing respectively one, two, three, or four points. It is quite evident that the form of the patterns transferred in this manner is considerably restricted, and that the process is highly complex and time-consuming especially because after each individual exposure an extremely precise alignment is required. For that reason, this process of making integrated circuits by means of corpuscular beam shadow printing was not accepted in the trade.

Figure 2:
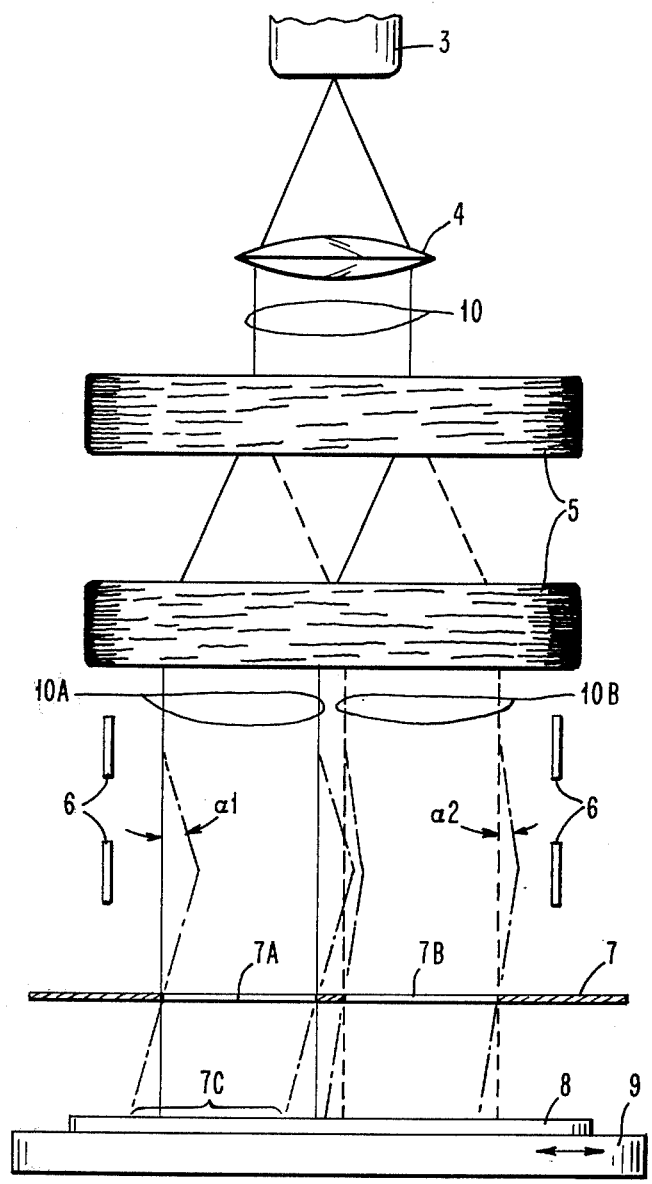
FIG. 2 is a device for carrying out the process as disclosed by the invention.

The device of FIG. 2 consists of an electron beam gun 3, an electron lens 4 converting the beam emanating from electron beam gun 3 into a parallel beam 10, a magnetic deflection device 5 for the parallel deflection of electron beam 10 into two coordinate directions, e.g., into one of the two positions marked 10A and 10B, and of an electrostatic deflection device 6 by which the electron beam can be controllably tilted about predetermined angles, e.g., from the positions 10A or 10B, about a point in the plane of mask 7. Furthermore, a mask 7 is provided which consists of areas 7A and 7B which are complementary to each other. The electron beams passing through the mask impinges onto a semiconductor wafer 8 which is arranged on a table 9 controllably shiftable in two directions perpendicular to each other, the movements of that table being interferometrically controlled.

Figure 3A:
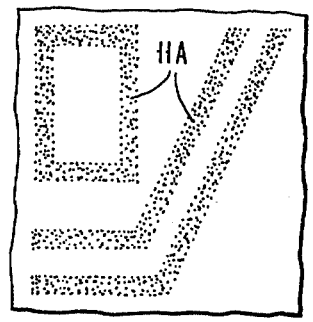
FIG. 3A to 3C is a pattern transferred by means of the process as disclosed by the invention and the complementary masks used for transferring the pattern.
Figure 3B:
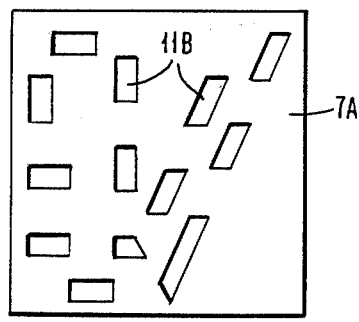
Figure 3C:
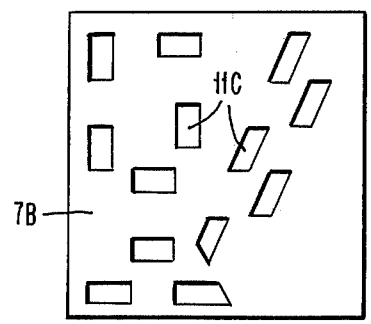

The two mask areas marked 7A and 7B contain for instance, openings 11B and 11C shown in FIGS. 3B and 3C.

For exposing pattern 11A represented in FIG. 3A by raster areas, table 9 carrying semiconductor wafer 8 is brought into its position shown in FIG. 2, and magnetic deflection device 5 is adjusted in such a manner that the electron beam is deflected into its position marked 10A and, on the path represented by full lines, impinges onto complementary mask 7A and, in the areas showing openings 11B, onto the photoresist layer covering semiconductor wafer 8. If by means of an alignment unit not shown, and alignment markings not shown, either, and provided on semiconductor wafer 8 it is found that the difference between the actual position and the nominal position of the semiconductor wafer differs from zero but does not exceed a predetermined maximum amount the path of the electron beam is tilted about a point in the plane of mask 7 by energizing the electrostatic deflection unit 6, so that the path follows the dash-dotted lines. Deflection angles $\alpha 1$ is set in such a manner that the difference between actual position and nominal position due to the erroneous adjustment of table 9 is compensated.

Subsequently, electron beam 10 is switched on and the photoresist layer under mask area 7A is exposed. After the exposure, table 9 is shifted to the right until the exposed area 7C of semiconductor wafer 8 is under the complementary mask zone 7B. Magnetic adjustment device 5 is set in such a manner that the path of electron beam 10 is brought into its position 10B represented by broken lines. If checking by the alignment device not shown, indicates that the actual position of exposed area 7C differs from its nominal position electrostatic deflection unit 6 is set in such a manner that the electron beam is tilted about a point in the plane of mask 7 by angle $\alpha^2$, so that it impinges onto semiconductor wafer 8 in an area limited by the dash-dotted lines.

If in this state of adjustment of devices 5 and 6, the electron beam gun is switched on the electron beam, in its path represented by dash-dotted lines impinges onto an area of semiconductor wafer 8 limited by these lines which, when actual and nominal position coincide due to the beam tilted by angle $\alpha2$ coincides exactly with area 7C already exposed through mask 7A. It is quite evident that the combination of openings 11B and 11C shown in FIGS. 3B and 3C produces pattern 11A shown in FIG. 3A. The deflection of electron beam 10 into its positions marked 10A and 10B by means of magnetic deflection unit 5, as well as the deflection by a selected angle $\alpha$ causing a tilting about a point in the plane of mask 7, by electrostatic deflection unit 6, can, of course, be executed not only in the plane of the drawing but in all directions, so that positioning errors occurring in any direction can be compensated.

If the difference between the nominal position and the actual position of wafer 8 exceeds the above mentioned maximum value a renewed coarse positioning is effected by shifting table 9, followed by a renewed fine positioning by altering angles $\alpha$ by means of electrostatic deflection unit 6.

As stated above, no very high demands are made to the accuracy of the programmed and interferometrically controlled shifts of table 9, so that these shifts can take place with high speed. This interferometrically controlled coarse positioning is followed by a fine positioning executed with extreme accuracy and speed by tilting the electron beam by adequate angles $\alpha$ about a point in or approximately in the plane of mask 7, that fine positioning being executed by adjusting the electrostatic deflection unit 6. The shifting of table 9, the evaluation and the correction of the interferometrically found nominal value deviations, the operating of deflection units 5 and 6, as well as the switching on and off of electron beam gun 3 can be very advantageously performed by a programmed computer. The process as disclosed by the invention can, of course, also be carried out semi-automatically with less extensive technical equipment.

While I have illustrated and described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by Letters Patent is:

1. A method of exposing a resist layer in semiconductor fabrication by particle beam shadow printing using a mask (7) having complementary zones (7A, 7B) arranged between a source of a particle beam (10) and close to a target object (8) that is controllably moveable with respect to the beam, and wherein the beam is controllably tiltable about a point approximately in the mask plane, including the steps of:

directing the beam onto a first complementary zone (7A) of the mask, shifting the exposed area (7C) of the target object under the second complementary zone (7B) of the mask, whereby the relative positioning of the particle beam with respect to the target object is changed, measuring alignment error by determining the deviation of the actual position of the exposed region (7C) from its nominal position, and compensating for the alignment error by tilting the particle beam about said point approximately in the plane of the mask.

2. The method of claim 1 wherein any identified alignment errors are compensated by moving a table (9) carrying the target object, and subsequently by tilting the particle beam (10) about a point approximately in the plane of the mask (7).

* * * * *